United States Patent
Sukharev et al.

(10) Patent No.: US 7,687,303 B1
(45) Date of Patent: Mar. 30, 2010

(54) METHOD FOR DETERMINING VIA/CONTACT PATTERN DENSITY EFFECT IN VIA/CONTACT ETCH RATE

(75) Inventors: Valeriy Sukharev, Cupertino, CA (US); Ara Markosian, Cupertino, CA (US)

(73) Assignee: Mentor Graphics Corporation, Wilsonville, OR (US)

(*) Notice: Subject to any disclaimer, the term of this patent is extended or adjusted under 35 U.S.C. 154(b) by 176 days.

(21) Appl. No.: 11/264,930

(22) Filed: Nov. 1, 2005

(51) Int. Cl.
H01L 21/44 (2006.01)
(52) U.S. Cl. .............. 438/68; 438/637; 438/700; 257/E21.17; 257/E21.218; 257/E21.57
(58) Field of Classification Search ............... 438/637, 438/700, 614, 514, 524, 680, 733, 734, 735, 438/740, 675, 668
See application file for complete search history.

(56) References Cited

U.S. PATENT DOCUMENTS

| | | | | |
|---|---|---|---|---|
| 4,473,437 | A * | 9/1984 | Higashikawa et al. | 216/67 |
| 4,673,456 | A * | 6/1987 | Spencer et al. | 156/345.36 |
| 5,965,034 | A * | 10/1999 | Vinogradov et al. | 216/68 |
| 6,127,275 | A * | 10/2000 | Flamm | 438/710 |
| 6,858,112 | B2 * | 2/2005 | Flamm et al. | 156/345.48 |

OTHER PUBLICATIONS

Valeriy Sukharev "2001 Proceedings Sixth International Checmical-Mechanical Planarization for ULSI Multilevel Interconnection Conference".

"Addressing the Pattern Density Effects in Deposition, Etch and CMP by Means of Simulations", Mar. 7-8, 2001 CMP-MIC Conference.
LSI Logic, 3115 Alfred Street, Santa Clara, CA 95054.
Seth T. Rodgers, et al. "Multiscale Modeling of Chemical Vapor Deposition", accepted for publication Sep. 26, 1997.
Department of Chemical Engineering, Massachusetts Institute of Technology, Cambridge Massachusetts 02139.
Matthias K. Gobbert, et al. "Mesoscopic Scale Modeling of Microloading During Low Pressure Chemical Vapor Deposition".
J. Electrochem. Soc., vol. 143, No. 8, Aug. 1996 @ The Electrochemical Society, Inc.
Department of Mathematics, Arizona State University, Tempe, Arizona 85287-1804, USP.
Center for Solid State Electronics Research, Arizona State University, Tempe, Arizona 85287-6206, USA.

* cited by examiner

Primary Examiner—David Nhu (57) ABSTRACT

A method for determining an effect of via/contact pattern density in via/contact etch rate of a wafer includes determining a neutral etchant species number flux intersecting each via/contact mouth as a function of local layout characteristics and determining variations in the neutral etchant species flux number as a function of the via/contact pattern density in a wafer scale. The comparison of these number fluxes provides the capability to discriminate an underetched or an overetched via/contact from normal vias/contacts satisfying an etch tolerance criterion. Chip designers can modify the layout design to minimize via/contact failures. Chip manufacturers can modify the etching process to minimize via/contact failures.

12 Claims, 6 Drawing Sheets

METHOD FOR DETERMINING VIA/CONTACT PATTERN DENSITY EFFECT IN VIA/CONTACT ETCH RATE

BACKGROUND

1. Field

The present invention relates to via/contact etch rates in semiconductor chip design and manufacturing, and more particularly to determining the via/contact pattern density effect in via/contact etch rate.

2. Related Art

Using a plasma etch process to create vias in the manufacturing of semiconductor chips is known in the art. Typically, based on currently employed dual-damascene technology metal lines are deposited with the electroplating process step into a dielectric layer previously patterned in the plasma etch process step. A patterned photoresist layer is deposited on top of the interlayer dielectric (ILD). Where the ILD is not covered by the photoresist, etchant from the plasma etches a feature. One of the most common integration schemes used today for 90 nm and 65 nm technological nodes is referred to as dual-inlaid "Via First Trench Last" (VFTL), meaning the via structure is etched before the trench. Ideally, the via is etched until an opening reaches an etch stop layer (dielectric barrier) previously deposited on the top of underneath metal layer. This barrier is etched (open) at the very last step in this VFTL scheme when the trench was etched, photoresist was striped, and the organic was removed. However, sometimes a via is over-etched or under-etched, affecting wafer yield. In an under-etch, the etching process stops before it reaches the etch stop layer, and inadequate electrical contact results. In an over-etch, the etching process continues even after it reaches the etch stop layer. This results in via CD widening, which can be responsible for the underneath metal line side-wall erosion. A similar situation takes place with the contact etch. The only difference is employment of silicide layers as etch stop layers and the absence of the trench etch step in process flow. A variety of control techniques are used for detection of the etch stop point to avoid the over-etch/under-etch. Aa an example of this technique we can mention an optical emission spectroscopy. When etch profile reaches the underneath etch stop layer, or silicide layer in the case of the contact etch, a sensing device detects a trace concentration of specific molecules in the gas phase and the etch process is terminated. Existing variation in etch rate can result in the situation that some of the vias/contacts will be still under-etched while some other already over-etched when the etch is stopped.

Figure 1A:
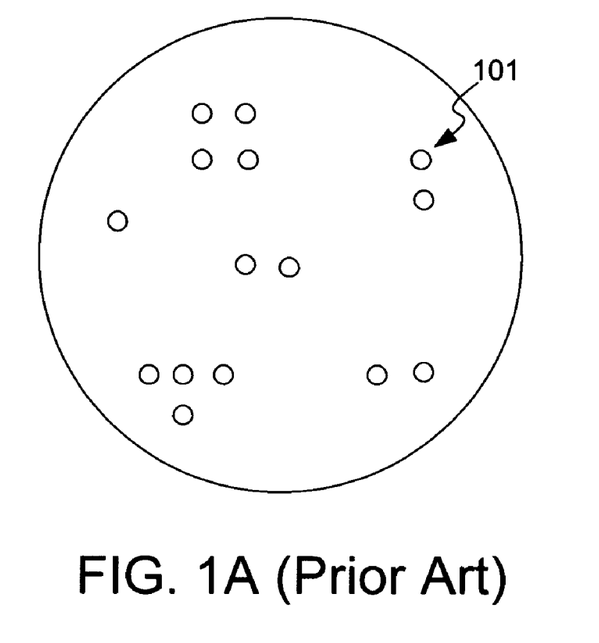
FIGS. 1A–1B are simplified diagrams of a fragment of the particular via layout and a cross-section of vias in a particular metal level or contacts in local interconnect layer.
Figure 1B:
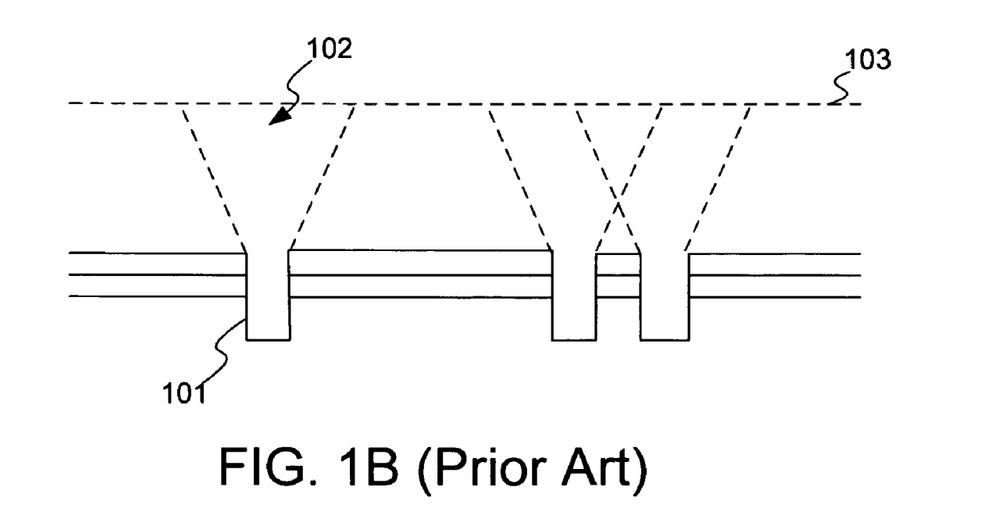

Variations in via/contact etch rates can result in the over-etch and under-etch of vias/contacts. This can be due to non-uniform via/contact density patterns on a wafer. FIGS. 1A–1B are simplified diagrams of a via layout on a wafer surface and a cross-section of vias in a via-layer, respectively. As illustrated in FIG. 1A, the vias are not uniformly distributed across a layout, leading to the microloading effect, which means a depletion in reactive gas species, which are needed for surface etching reactions (etchant), in the wafer regions where a higher etchant consumption occurs due to the greater via/contact density. This happens because of a reactant transport (by means of gas phase diffusion and flow) limitations which do not allow alleviation of concentration gradients over the length scale of the via/contact density variations. Additional variations in via/contact etch rates come from the neighbor features competiting for etchant species. As illustrated in FIG. 1B, when vias are close together, their respective regions of the surrounding gas phase, which supply etchant species for etching reactions, may overlap. These regions are restricted by the line of sight forming the solid angle from which the plasma bulk can be observed from the via inside. Because of a ballistic nature of the reactant transport, which takes place at the typical gas pressures used for plasma etch, only reactant located inside this solid angle can reach a corresponding feature and participate in etching reactions. These vias, characterized by overlapped gas phase "supply" regions should "share" reactants, that results in further reduction in etch rate. Local configuration in vias/contacts location strongly influences this overlap resulting in enhanced variations in etch rates. Some specific fragments of the via/contact layout can be responsible for creation of a strong reactant flux depletion resulting in severe via/contact under-etch.

Accordingly, there exists a need for a method for determining the effect of via/contact pattern density in via/contact etch rate. By determining this effect, chip designers can check the layout design regarding elimination of hot spots responsible for a prospective via/contact under-etch and modify it to minimize via/contact failures. Similarly, chip manufacturers can modify the etching process to minimize via/contact failures. The present invention addresses such a need.

SUMMARY

A method for determining an effect of via/contact pattern density in via/contact etch rate includes determining a neutral etchant species number flux intersecting each via/contact mouth as a function of local layout characteristics and determining variations in the neutral etchant species flux number as a function of the via/contact pattern density in a wafer scale. The comparison of these number fluxes provides the capability to discriminate an under-etched or an over-etched via/contact from normal vias/contacts satisfying an etch tolerance criterion. Chip designers can modify the layout design to minimize via/contact failures. Chip manufacturers can modify the etching process to minimize via/contact failures.

DETAILED DESCRIPTION

Figure 2:
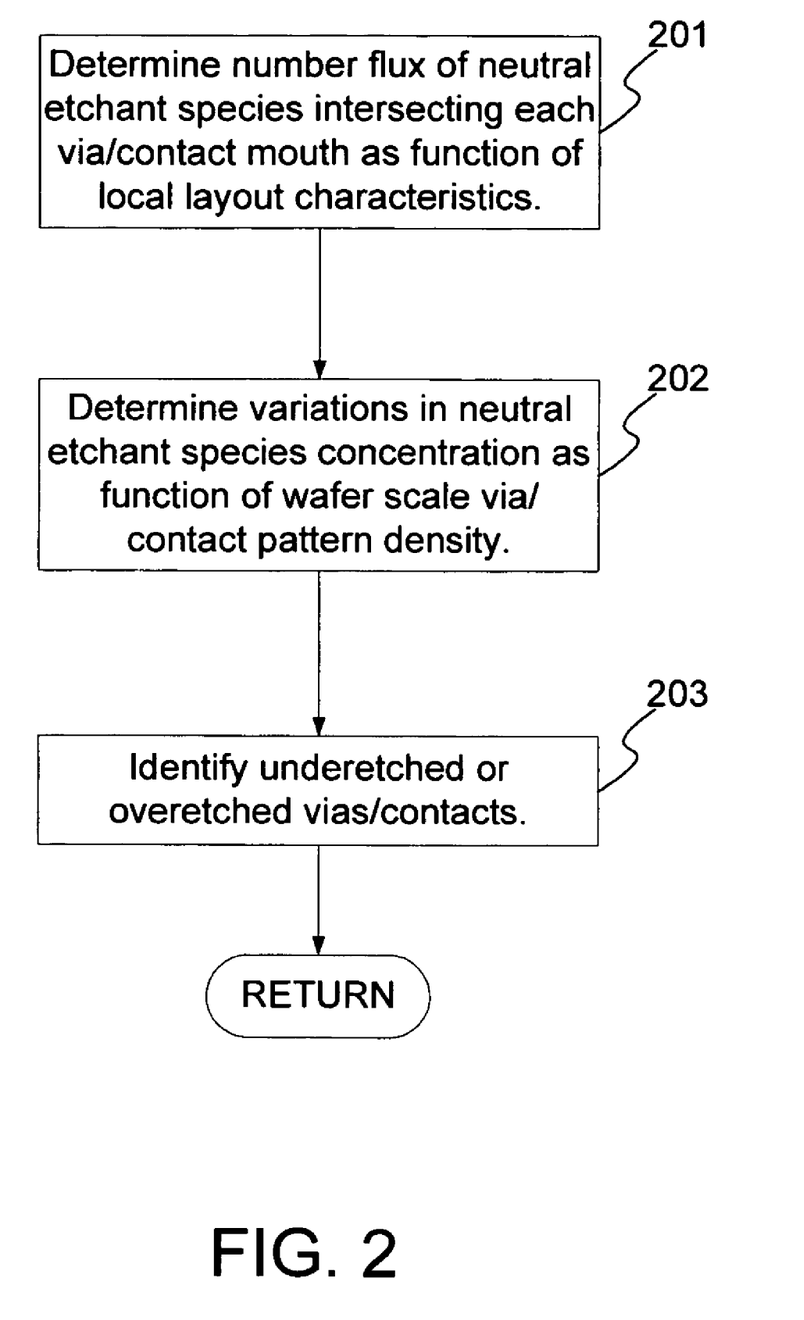
FIG. 2 is a flowchart illustrating an embodiment of a method for determining the effect of via/contact pattern density in via/contact etch rate.

As illustrated in the flowchart in FIG. 2, the inventive method determines a number flux of neutral etchant species intersecting each via/contact mouth as a function of local layout characteristics (step 201) and variations in neutral etchant species concentration as a function of wafer scale via/contact layout pattern density (step 202). From these determinations, underetched or overetched vias/contacts can be identified (step 203). Phenomenon that affect via/contact size and shape are not considered in an embodiment of the inventive method as these phenomenon affect all vias/contacts in the same manner. Examples of these phenomenon includes ions etchant species and via/contact aspect ratios.

FIGS. 3 through 9 and the accompanying text further describes the method.

Figure 3:
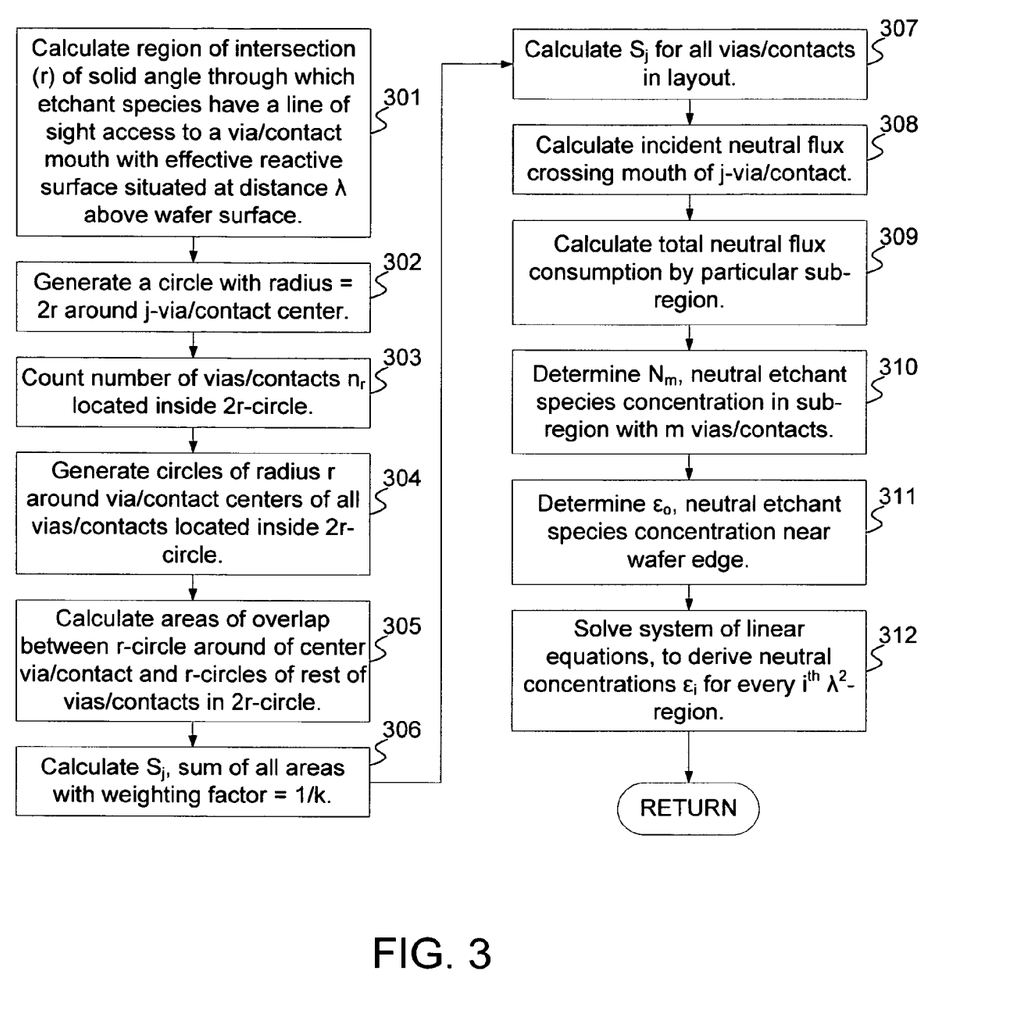
FIG. 3 is a flowchart illustrating in more detail the embodiment of the method for determining the effect of via/contact pattern density in via/contact etch rate.
Figure 4:
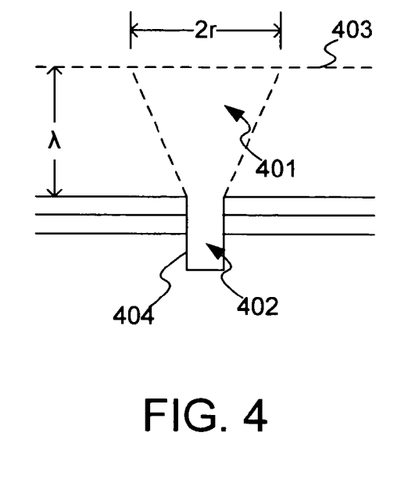
FIG. 4 illustrates a region (r) of solid angle.
Figure 5:
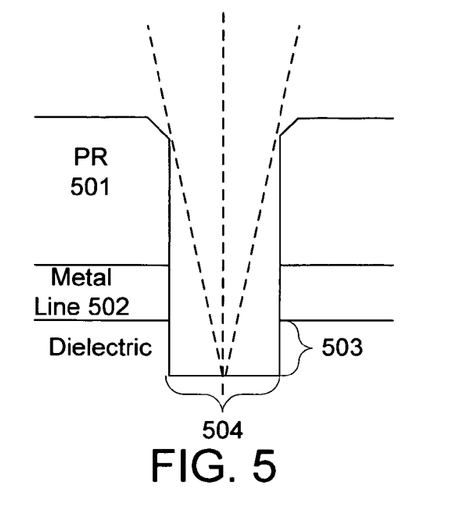
FIG. 5 illustrates an aspect ratio of a via/contact.

FIG. 3 is a flowchart illustrating in more detail the method for determining the effect of via/contact pattern density in via/contact etch rate in accordance with the present invention. First, as illustrated in FIG. 4, a region 401 of intersection (r) of solid angle, through which etchant species have a line of sight to a via mouth 402, is calculated at a point located at the effective reactive surface 403 situated at a distance $\lambda$ from the wafer surface (step 301), where $\lambda$ is the mean free path of neutral etchant species. Here, $$r = \frac{2\lambda}{AR} \quad (1)$$

where AR is the effective via/contact aspect ratio. As illustrated in FIG. 5, $$AR = \frac{h_{PR} + h_{Me} + h_{Via}}{d_{Via}} \quad (2)$$

where $h_{PR}$ is the thickness of the photoresist layer 501, $h_{Me}$ is the thickness of the metal layer 502, $h_{Via}$ is the thickness of the via/contact height 503, and $d_{Via}$ is the via/contact diameter 504.

Figure 6:
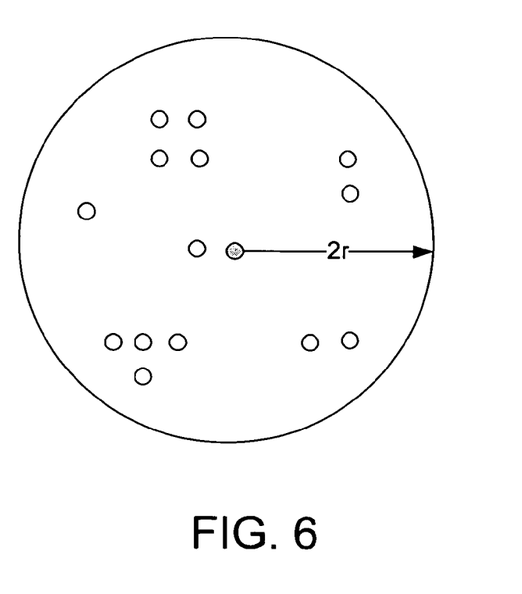
FIG. 6 illustrates a 2r-circle.
Figure 7:
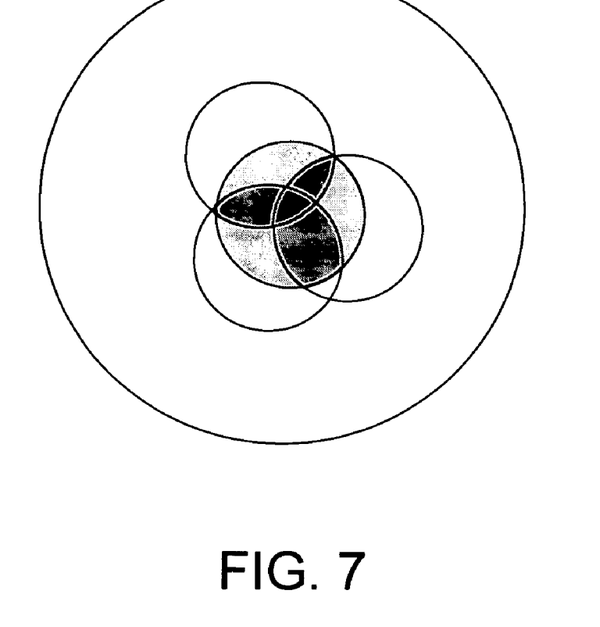
FIG. 7 illustrates overlapping r-circles within a 2r-circle.

Next, as illustrated in FIG. 6, a circle with radius=2r is generated around the center of the j-via/contact (step 302). The number of vias/contacts $n_r$ located inside the 2r-radius circle is counted (step 303). Circles of radius r are then generated around the via/contact centers of all vias/contacts located inside the 2-r circle (step 304). Areas of overlap between the r-circle of the center via/contact and the r-circles of the rest of the vias/contacts in the 2r-circle is calculated (step 305). FIG. 7 illustrates an example of such overlapping areas. The sum, $S_j$, of all these areas is calculated with the weighting factor 1/k (step 306):

$$S_j = \sum_{k=1}^{n} \frac{1}{k} S_k \quad (3)$$

where k is the number of the overlapped circles, n is the number of vias/contacts located inside the 2r-circle, and $S_k$ is the area of k-overlapped region.

$S_j$ is calculated for all vias/contacts in the via/contact layout (step 307).

Next, the incident neutral flux, $\Gamma_j$, crossing the mouth of the j-via/contact is calculated (step 308):

$$\Gamma_j = \Gamma_n S_j \quad (4)$$

Here, $\Gamma_n$, is a total number flux consumed by all n vias located inside the 2-r circle. Difference is Sj, caused by the difference in via/contact density, as well as by the difference in local via/contact positioning (i.e., layout characteristics), result in different fluxes consumed by different vias/contacts in the course of a via/contact-etch process.

Differences in the via/contact density across the wafer results in the differences in neutrals consumption in different regions of the wafer. It generates different steady state concentrations of neutral species distributed above the wafer surface. To determine the neutrals concentration distribution at the wafer surface, a mass balance between the neutrals coming from the plasma bulk and consumed by an etch related chemical reaction should be considered. The continuum model of chemical species transport is not applicable for scales below $\lambda$. To avoid this problem, the "effective reactive surface" is defined above the real wafer surface at the distance $\lambda$. All regions between the effective reactive surface and the wafer with a thickness of $\lambda$ is subdivided into a number of rectangular sub-regions with the lateral dimensions of the order of $\lambda$. The internal bulk of each sub-region is characterized by a ballistic transport of neutrals, along the lines of sight. Radicals arrive from the plasma area, located above the effective reactive surface, penetrate the bulk of the ballistic region, and collide with the wafer surface. Radicals colliding with the photoresist surface are assumed to be reflected by this surface in almost 100% of the cases. Radicals penetrating the vias/contacts mouths are consumed by the etch reactions with the probability described by the coefficient $k_{eff}$.

The total neutral flux consumed by a particular sub-region ($\lambda^2$-region) is calculated (step 309):

$$\Gamma_m \approx \Gamma_o\left(\frac{\delta\Omega}{2\pi}\right)S_\Sigma m k_{eff} \approx \frac{N_m \bar{c}}{4} \frac{1}{2\pi}\left(\frac{\Theta}{\lambda^2}\right)S_\Sigma m k_{eff} = \quad (5)$$

$$\frac{N_m \bar{c} \Theta m S_\Sigma}{8\pi\lambda^2} k_{eff} = \varphi_m N_m$$

Figure 8:
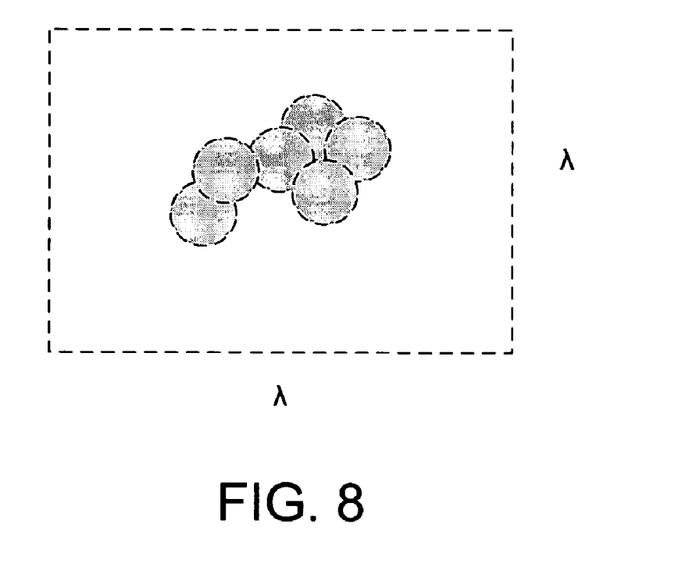
FIG. 8 illustrates a total area covered by m number of r-circles for m number of vias/contacts in a wafer sub-region.

Here, c is the gas thermal velocity, m is the number of vias/contacts in this particular $\lambda^2$-region, $\delta\Omega$ is a solid angle, through which the j-via/contact mouth is "visible" from the flux generating point located at the effective reactive surface, $\Theta$ is the area of the j-via/contact mouth (photoresist open area), $S_\Sigma$ is the total area covered by the m circles of radius r corresponding to these m vias/contacts (See FIG. 8, where shaded area is $S_\Sigma$ inside a $\lambda^2$ sub-region).

Figure 9:
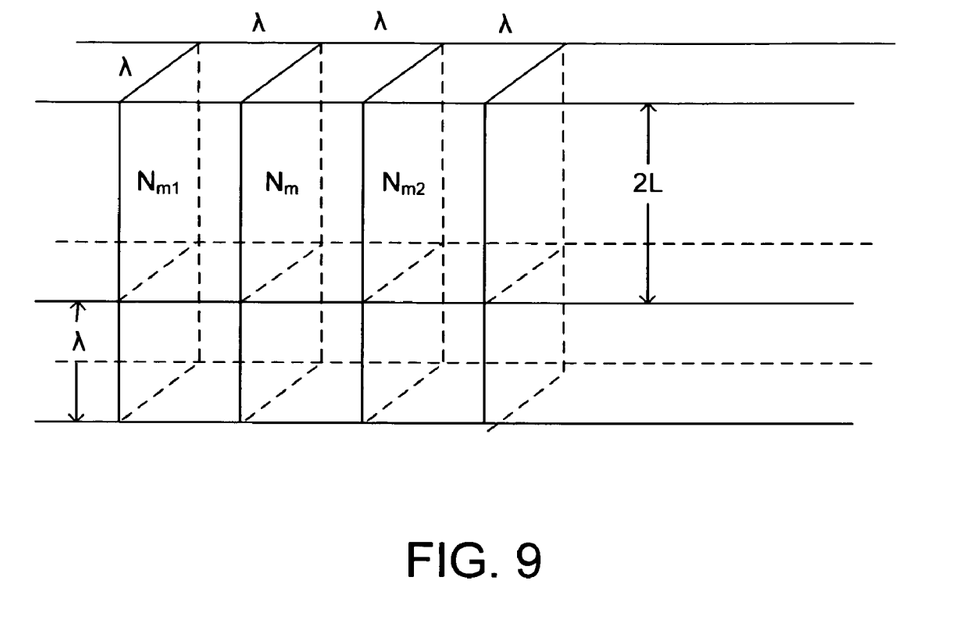
FIG. 9 illustrates a wafer area subdivided into sub-regions with side length of $\lambda$.

Next, $N_m$ is determined (step 310). To determine $N_m$, as illustrated in FIG. 9, the entire wafer area is subdivided into sub-regions with side length of $\lambda$. The number of vias/contacts $\{m_i\}$ in every i-th $\lambda^2$-region is counted, and $S_\Sigma$ for every i-th $\lambda^2$-region is calculated.

The mass balance equation for every sub-region of the size $2L\times\lambda^2$ has the form:

$$2L\lambda^2\gamma - \Gamma_m - 2L\lambda D \sum_{k=1}^{4} \frac{(N_m - N_{m_k})}{\lambda} = 0 \quad (6)$$

Here, 2L is an electrode gap in the capacitive coupled plasma (CCP) reactor, or the characteristic size of the plasma region in vertical direction for any other type of the plasma reactor, $\gamma$ is a rate of the homogeneous generation of neutral etchant species in a discharge. The value of $\gamma$ depends on the gas mixture employed for a particular process, plasma parameters such as electron temperature, electron distribution, reactor geometry, discharge power, total pressure, feed gas flow rate etc. $N_{m_k}$ is the neutral species concentration in four neighbor sub-regions, D is a diffusion coefficient of neutrals, that, as well as a mean free path $\lambda$ can be calculated for any particular gas mixture based on the Chapman-Enskog kinetic theory.

Equation (6) can be modified to represent a variable in a dimensionless form:

$$\xi_m \left( \frac{\varphi_m}{2LD} + 4 \right) - \sum_{k=1}^{4} \xi_{m_k} = 1 \quad (7)$$

where $$\xi_i = N_i \frac{D}{\gamma \lambda^2} \quad \varphi_m = \frac{\bar{c} \Theta m S_\Sigma}{8\pi\lambda^2} k_{eff}$$

Taking into consideration the simple relation $$D = \frac{\lambda \bar{c}}{3},$$

equation (8) below can be written:

$$\frac{\varphi_m}{2LD} = \frac{3}{64} \frac{d_{via}^2 S_\Sigma}{\lambda^3 L} m k_{eff} \quad (8)$$

Hence, the problem of determinating of the distribution of steady state concentration of neutral species above the wafer surface is concluded to the solution of a system of the liner algebraic equations (7) (step 312).

The die is represented by the following table. Each cell represents a $\lambda^2$-region, and $\xi_{i,j}$

| $\xi_0$ | $\xi_0$ | $\xi_0$ | $\xi_0$ | $\xi_0$ | ... | ... | $\xi_0$ | $\xi_0$ | |
|---|---|---|---|---|---|---|---|---|---|
| $\xi_0$ | $\xi_{1,1}$ | $\xi_{1,2}$ | $\xi_{1,3}$ | | | | $\xi_{1,m-1}$ | $\xi_{1,m}$ | $\xi_0$ |
| $\xi_0$ | $\xi_{2,1}$ | $\xi_{2,2}$ | $\xi_{2,3}$ | | | | $\xi_{2,m-1}$ | $\xi_{2,m}$ | $\xi_0$ |
| $\xi_0$ | $\xi_{3,1}$ | $\xi_{3,2}$ | $\xi_{3,3}$ | ... | | | $\xi_{3,m-1}$ | $\xi_{3,m}$ | $\xi_0$ |
| ... | | | ... | | $\xi_{i-1,j}$ | | | | ... |
| ... | | | | $\xi_{i,j-1}$ | $\xi_{i,j}$ | $\xi_{i,j+1}$ | | | ... |
| ... | | | | | $\xi_{i+1,j}$ | | | | ... |
| ... | | | | | | | | | ... |
| $\xi_0$ | $\xi_{m,1}$ | $\xi_{m,2}$ | $\xi_{m,3}$ | | | | $\xi_{m,m-1}$ | $\xi_{m,m}$ | $\xi_0$ |
| | $\xi_0$ | $\xi_0$ | $\xi_0$ | $\xi_0$ | ... | ... | $\xi_0$ | $\xi_0$ | | is the corresponding dimensionless concentration. Five cells in the center of the die illustrate the neighboring $\lambda^2$-regions which are involved in a diffusion-like species exchange. $\xi_0$ is the concentration of neutral species at the areas free of vias/contacts. We assume that the wafer edge is characterized by the same $\xi_0$.

To determine $\xi_0$ (step 311), the following "reactor scale" mass balance equation is considered:

$$Q_{out} N_{out} - Q_{in} N_{in} = \gamma V - n_d \sum_{m=1}^{l} \Gamma_k \quad (9)$$

where $V = 2L \pi R_w^2$.

$Q_{in}$ and $Q_{out}$ are the inlet and outlet flow rates of neutral etchant species, $R_w$ is the wafer radius, and V is the reactor volume. Neutral etchants are generated by plasma chemical reactions inside reactor. Hence, $Q_{in}=0$, and $Q_{in}=Q$, $N_{out}=N_0$. $L_d$ and $n_d$ are the die linear dimension and number of dies on the wafer, l is a number of $\lambda^2$-regions in the die $l=(L_d/\lambda)^2$. Hence, eq. (8) can be rewritten $$\frac{\lambda^2}{D} \frac{Q}{2L} \xi_0 = S_w - \lambda^2 n_d \sum_{k=1}^{l} \xi_k \frac{\varphi_k}{2LD} \quad (10)$$

$$S_w = \pi R_w^2$$

$S_w$ is the wafer area. From eq. (7):

$$\xi_k \approx \frac{2LD}{\varphi_k} = \frac{16\pi\lambda^2 LD}{\bar{c}\Theta m S_\Sigma k_{eff}} \quad (11)$$

Thus, $\xi_0$ can be derived from Eqs. (10) and (11)

$$\xi_0 = \frac{S_w - n_d S_d}{\frac{\lambda^2 Q}{2LD}} \quad (12)$$

Here, $S_d = L_d^2$ is the area of a single die.

Hence, if the inlet feed gas flow rate (Q), inter-electrode gap (2L), gas ratio, and total pressure and temperature are known, $\xi_0$ can be determined based on eq. (12). Knowing $\xi_0$ and previously calculated $S_j$, which is based on layout information, allows for the solving of the system of linear equations (7) and to derive the neutral concentrations $\xi_i$ for every i-th $\lambda^2$-region. It allows for the calculation of relative fluxes of neutral etchant species intersecting each via/contact mouth. The following comparison of these fluxes should provide us with the capability to discriminate an under-etched or an over-etched vias/contacts from the normal ones satisfying the etch tolerance criterion.

In one embodiment, the following parameter estimations are used:

r=0.035 cm $$\frac{\varphi_m}{2LD} \approx 1 \times 10^{-9} \times m \times S_\Sigma$$

$\lambda \approx 0.2$ cm $\xi_0 \approx 0.5$ $$l = \frac{S_d}{\lambda^2} \approx 25 \times S_d$$

where, m is the number of vias/contacts in a particular $\lambda^2$ area (random number), $S_d$ is the die area in cm$^2$, l is the number of the $\lambda^2$ areas inside a die and a number of equations in the system (7).

In one embodiment, the following etch process recipe and basic reactor geometry parameters are obtained to apply the inventive method:

Gap between top electrode and wafer or, more general, a vertical linear dimension of the plasma region (2L)

Solid angle region (r)

Total gas pressure, temperature and gas mixture ratio for calculation of the relevant diffusion coefficients and mean free paths (D and λ)

Inlet gas mixture flow rate (Q)

Direct knowledge of these sensitive parameters can be replaced by the data regarding the Peclet, Damkohler numbers and the Thiele modulus of the specific etch processes.

Foregoing described embodiments of the invention are provided as illustrations and descriptions. They are not intended to limit the invention to precise form described. In particular, it is contemplated that functional implementation of invention described herein may be implemented equivalently in hardware, software, firmware, and/or other available functional components or building blocks, and that networks may be wired, wireless, or a combination of wired and wireless. Other variations and embodiments are possible in light of above teachings, and it is thus intended that the scope of invention not be limited by this Detailed Description, but rather by Claims following.

We claim:

1. A method for improving wafer yield in response to analysis of effects of via or contact pattern density on via or contact etch rate of a wafer, comprising the steps of:
   (a) determining a neutral etchant species number flux intersecting each via or each contact mouth as a function of local layout characteristics;
   (b) determining variations in a neutral etchant species concentration as a function of the via or contact pattern density in a via or a contact layout; and
   (c) adjusting the layout and etching process to reduce via failures.

2. The method for improving wafer yield according to claim 1, further comprising identifying underetched or overetched vias or contacts.

3. The method for improving wafer yield according to claim 1, wherein the determining step (a) comprises:
   (a1) calculating a region of intersection (r) of solid angle, through which neutral etchant species have a line of sight access to a via$_j$ or contact$_j$ mouth, with an effective reactive surface situated at a distance λ above a wafer surface, wherein λ is a mean free path;
   (a2) generating a circle with a radius equal to $2_r$ around the via or the contact$_j$;
   (a3) counting a number of vias or contacts ($n_r$) located inside the $2_r$-circle;
   (a4) generating circles of radius equal to r around via or contact centers of each via or contact located inside the $2_r$-circle;
   (a5) calculating areas of overlap between the r-circle of a center via or contact in the $2_r$-circle and r-circles of the rest of the vias or contacts in the $2_r$-circle;
   (a6) calculating a sum ($S_j$) of the areas of overlap with a weighting factor of 1/k, wherein k is a number of overlapped r-circles;
   (a7) calculating $S_j$ for all vias or contacts in the layout; and
   (a8) calculating an incident neutral flux ($\Gamma_j$) crossing the mouth of the via or contact$_j$.

4. The method for improving wafer yield according to claim 3, wherein for the calculating step (a1), $$r = \frac{2\lambda}{AR},$$

wherein AR is a via or contact aspect ration, wherein $$AR = \frac{h_{PR} + h_{Me} + h_{Via}}{d_{Via}},$$

wherein $h_{PR}$ is a thickness of a photoresist layer, $h_{Me}$ is a thickness of a metal layer, $h_{Via}$ is a thickness of a via or contact height, and $d_{Via}$ is a via or contact diameter.

5. The method for improving wafer yield according to claim 3, wherein for the calculating step (a6), $$S_j = \sum_{k=1}^{n} \frac{1}{k} S_k,$$

wherein n is a number of vias or contacts located inside the $2_r$-circle, and $S_k$ is an area of the k-overlapped regions.

6. The method for improving wafer yield according to claim 3, wherein for the calculating step (a8), $\Gamma_j = \Gamma_n S_j$, wherein $\Gamma_n$ is a total number flux consumed by all a wafer regions containing n vias or contacts.

7. The method for improving wafer yield according to claim 1, wherein the determining step (b) comprises:
   (b1) calculating a total neutral flux consumption ($\Gamma_m$) by a sub-region of the wafer;
   (b2) determining a neutral etchant species concentration ($N_m$) of m number of vias or contacts in the sub-region;
   (b3) determining a neutral etchant species concentration ($\zeta_0$) near a wafer edge; and
   (b4) solving a system of linear equations to derive neutral concentrations ($\zeta_i$) for every $i^{th}$ sub-region.

8. The method for improving wafer yield according to claim 7, wherein for the calculating step (b1), $$\Gamma_m \approx \Gamma_o \left(\frac{\delta\Omega}{2\pi}\right) S_\Sigma m k_{eff} \approx \frac{N_m \bar{c}}{4} \frac{1}{2\pi}\left(\frac{\Theta}{\lambda^2}\right) S_\Sigma m k_{eff} = \frac{N_m \bar{c} \Theta m S_\Sigma}{8\pi\lambda^2} k_{eff} = \varphi_m N_m,$$

wherein m is a number of vias or contacts in the sub-region, $\delta\Omega$ is a solid angle through which via$_j$ or contact$_j$ mouth is "visible" from a flux generating point located at an effective reactive surface, $\Theta$ is an area of the via$_j$ or the contact mouth, $S_\Sigma$ is a total area covered by m r-circles corresponding to m vias or contacts, c is a gas thermal velocity, $k_{eff}$ is a coefficient describing a probability that radicals penetrating a via or contact mouth are consumed by etch reactions, and λ is a mean free path.

9. The method for improving wafer yield according to claim 7, wherein for the determining step (b2), a mass balance equation for the sub-regions is $$2L\lambda^2 \gamma - \Gamma_m - 2L\lambda D \sum_{k=1}^{4} \frac{(N_m - N_{m_k})}{\lambda} = 0,$$

wherein 2L is an electrode gap in a capacitive coupled plasma reactor, or the characteristic size of the plasma region in vertical direction for any other type of plasma reactor, γ is a rate of homogeneous generation of neutral etchant species in a discharge, $N_{mk}$ is a neutral species concentration in a 4 neighbor sub-regions, D is a diffusion coefficient of neutrals, and $\lambda$ is a mean free path, wherein the mass balance equation can be modified to the system of linear equations:

$$\xi_m\left(\frac{\varphi_m}{2LD}+4\right) - \sum_{k=1}^{4} \xi_{m_k} = 1, \text{ where } \xi_i = N_i\frac{D}{\gamma\lambda^2} \text{ and } \varphi_m = \frac{\bar{c}\Theta m S_\Sigma}{8\pi\lambda^2}k_{\textit{eff}}.$$

10. The method for improving wafer yield according to claim 7, wherein for the determining step (b3), $$\xi_o = \frac{S_w - n_d S_d}{\frac{\lambda^2 Q}{2LD}},$$

wherein $S_w$ is a wafer area, $S_d$ is an area of a single die, Q is an inlet feed gas flow rate, 2L is an inter-electrode gap, or the characteristic size of a plasma region in a vertical direction for any other type of the plasma reactor, $n_d$ is a number of dies on a wafer, and $\lambda$ is a mean free path.

11. The method for improving wafer yield according to claim 1 wherein the determining step (a) comprises the calculation of relative fluxes of neutral etchant species intersecting each via/contact mouth.

12. The method for improving wafer yield according to claim 11 further comprising a comparison of said relative fluxes to discriminate under-etched or over-etched vias/contacts from the normal ones satisfying the etch tolerance criterion.

* * * * *